United States Patent
Pimenta Barros et al.

(10) Patent No.: US 9,535,329 B2
(45) Date of Patent: Jan. 3, 2017

(54) GRAPHO-EPITAXY METHOD FOR MAKING PATTERNS ON THE SURFACE OF A SUBSTRATE

(71) Applicant: Commissariat à l'énergie atomique et aux énergies alternatives, Paris (FR)

(72) Inventors: Patricia Pimenta Barros, Grenoble (FR); Raluca Tiron, Saint-Martin-le-Vinoux (FR); Xavier Chevalier, Grenoble (FR); Ahmed Gharbi, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/854,951

(22) Filed: Sep. 15, 2015

(65) Prior Publication Data
US 2016/0077439 A1   Mar. 17, 2016

(30) Foreign Application Priority Data
Sep. 16, 2014   (FR) .................... 14 58748

(51) Int. Cl.
*H01L 21/311*   (2006.01)
*G03F 7/40*   (2006.01)
(Continued)

(52) U.S. Cl.
CPC .............. *G03F 7/40* (2013.01); *G03F 7/002* (2013.01); *G03F 7/162* (2013.01);
(Continued)

(58) Field of Classification Search
CPC ............. H01L 21/0273; H01L 21/0337; H01L 21/3086
(Continued)

(56) References Cited

U.S. PATENT DOCUMENTS

2014/0021166 A1   1/2014   Seino et al.
2014/0057443 A1   2/2014   Kubota et al.

FOREIGN PATENT DOCUMENTS

WO   WO 2013/146538 A1   10/2013

OTHER PUBLICATIONS

Search Report as issued in French Patent Application No. 1458748, dated May 27, 2015.
Delalande, M., et al., "Development of plasma etching processes to pattern sub-15 nm features with PS-b-PMMA block copolymer masks: Application to advanced CMOS technology," J. Vac. Sci. Technol. B 32(5), Sep./Oct. 2014, pp. 051806-1-051806-12.
(Continued)

*Primary Examiner* — Roberts Culbert
(74) *Attorney, Agent, or Firm* — Pillsbury Winthrop Shaw Pittman LLP (57) ABSTRACT

A method for making patterns on a substrate, includes forming an assembly guide on first and second areas of the substrate, the assembly guide having, compared to a reference surface, openings with an opening ratio in the first area greater than that of the second area; depositing a block copolymer layer on the substrate to entirely fill the assembly guide and form an over-thickness on the reference surface; assembling the block copolymer, resulting in an organised portion of the block copolymer layer inside the openings; thinning uniformly the block copolymer layer, until a thickness corresponding to the organised portion of the block copolymer layer is reached; eliminating one of the phases of the assembled block copolymer, resulting in a plurality of initial patterns extending into the layer of block copolymer; and transferring the initial patterns of the block copolymer layer into the substrate to form the final patterns.

17 Claims, 3 Drawing Sheets

(51) Int. Cl.
   G03F 7/16      (2006.01)
   G03F 7/00      (2006.01)
   H01L 21/027    (2006.01)
   H01L 21/033    (2006.01)
   H01L 21/308    (2006.01)

(52) U.S. Cl.
   CPC ...... *H01L 21/0273* (2013.01); *H01L 21/0337* (2013.01); *H01L 21/3086* (2013.01)

(58) Field of Classification Search
   USPC .......................................... 216/38; 438/694
   See application file for complete search history.

(56) References Cited

OTHER PUBLICATIONS

Oria, L., et al., "Guided self-assembly of block-copolymer for CMOS technology: a comparative study between grapho-epitaxy and surface chemical modification," SPIE 2011, vol. 7970-24.

Pimenta Barros, P., et al., "Etch challenges for DSA implementation in CMOS via patterning," SPIE Proceedings vol. 9054, Mar. 2014.

Stillwagon, L.E., et al., "Planarization of Substrate Topography by Spin Coating," J. Electrochem. Soc. 1987, vol. 134, issue 8, pp. 2030-2037.

Gupta, S.A., et al., "A parametric Study of Spin Coating over Topography," Ind. Eng. Chem. Res. 1998, vol. 37, No. 6, pp. 2223-2227.

Meyerhofer, D., "Characteristics of resist films produced by spinning," J. Appl. Phys., vol. 49, No. 7, Jul. 1978, pp. 3993-3997.

GRAPHO-EPITAXY METHOD FOR MAKING PATTERNS ON THE SURFACE OF A SUBSTRATE

CROSS-REFERENCE TO RELATED APPLICATIONS

This application claims priority to French Patent Application No. 1458748, filed Sep. 16, 2014, the entire content of which is incorporated herein by reference in its entirety.

FIELD

The present invention relates to techniques of directed self-assembly (DSA) of block copolymers in order to generate patterns of very high resolution and density. The invention relates more particularly to a method for making patterns on the surface of a substrate, such as contact holes or trenches, using block copolymers.

BACKGROUND

The needs of methods for making patterns of nanometric dimensions have increased sharply over recent years, due to the trend of miniaturisation of electronic components.

Initially, the patterns were made by optical projection lithography. In this production method, a photosensitive layer is deposited on a substrate, then exposed to an ultraviolet beam through a mask defining the patterns. The size of the smallest pattern that can be made (also called critical dimension "CD") is closely linked to the wavelength of the beam used: the shorter the wavelength, the finer the pattern made and the higher the integration density of these patterns in an integrated circuit.

The ultraviolet beams used in photolithography traditionally have a wavelength of 193 nm or 248 nm. This method of defining patterns has the advantage of being well controlled and less expensive than other methods, especially electronic lithography methods. Nevertheless, with such wavelengths, the resolution of the exposure tool is limited.

In order to make finer, better resolved patterns, and thus further increase the integration density, new methods have been developed, such as double exposure (double-patterning) photolithography, extreme ultraviolet (EUV) lithography and electron beam (e-beam) lithography.

Among emerging lithography technologies, it is also possible to cite techniques of directed self-assembly (DSA) of block copolymers. Block copolymers are polymers in which two repeating units, a monomer A and a monomer B, form chains bound together by a covalent bond. When sufficient mobility is given to the chains, for example by heating these block copolymers, the chain A and the chain B have a tendency to separate into phases or blocks and to reorganise themselves under specific conformations, which depend especially on the ratio between the monomer A and the monomer B. As a function of this ratio, it is possible for example to have spheres of monomer A in a matrix of monomer B, or instead cylinders of A in a matrix of B, or instead intercalated lamellae of A and lamellae of B. The size of the domains of block A (respectively block B) is directly proportional to the length of the chains of monomer A (respectively monomer B). Block copolymers thus have the property of forming patterns which can be controlled using the ratio of monomers.

Known techniques of self-assembly of block copolymers can be grouped together into two categories, grapho-epitaxy and chemi-epitaxy, both described in detail in the article ["Guided self-assembly of block-copolymer for CMOS technology: a comparative study between grapho-epitaxy and surface chemical modification", L. Oria et al., SPIE 2011, Vol. 7970-24].

Chemi-epitaxy consists in modifying the chemical properties of certain portions of the substrate, to force the organisation of the blocks of copolymer between these portions. These chemically modified portions of the substrate are typically delimited by a photolithography step followed by a plasma step.

Alternatively, grapho-epitaxy consists in forming primary patterns called guides on the surface of a substrate, these patterns delimiting areas inside which a layer of block copolymer is deposited. The guiding patterns make it possible to control the organisation of the blocks of copolymer to form secondary patterns of higher resolution inside these areas. The guiding patterns are conventionally formed by photolithography in a layer of resin, and potentially, transferred into a hard mask.

The technique of grapho-epitaxy has recently been used to form contact holes in an integrated circuit. After deposition and assembly of the block copolymer in the guiding patterns, the secondary patterns are developed by selectively removing one of the two blocks of the copolymer (for example the cylinders of A), thereby forming holes in the remaining layer of copolymer (the matrix of B). Then, these holes are transferred by etching onto the surface of the substrate, generally in a dielectric layer.

Thanks to this technique, it is possible to reduce the dimension of the patterns (application called "contact shrink"), the secondary pattern being of smaller dimensions than the primary pattern, i.e. the guiding pattern. There is then only a single contact hole per guiding pattern. It is also possible to multiply the number of patterns, by forming several contact holes per guiding pattern ("contact multiplication").

As discussed in the article ["Etch challenges for DSA implementation in CMOS via patterning", P. Pimenta Barros et al., SPIE Proceedings Vol. 9054, March 2014], current grapho-epitaxy methods are dependent on the density of the guiding patterns on the substrate. In fact, since the filling of the guiding patterns takes place by spin coating, the thickness of the block copolymer layer inside a guiding pattern depends on its surface area, its aspect ratio (depth/width) and the number of guiding patterns nearby. Consequently, for guiding patterns of same dimensions, the thickness of the copolymer layer in an isolated pattern is greater than the thickness obtained in a plurality of close together patterns.

Yet, the thickness of the layer of copolymer in the assembly guides affects the transfer of the patterns by etching, because the layer of copolymer serves as etching mask. If in certain assembly guides the thickness of copolymer is too low, an increase in the critical dimension of the patterns may occur during their transfer, because the etching mask is insufficient. Conversely, when the thickness of copolymer is too high, contact holes may be missing, their transfer having failed.

The thickness of the copolymer layer also affects the step of self-assembly of the block copolymer. In fact, a too low or too high thickness of the copolymer layer in the guides can lead to a poor organisation of the blocks. In particular, certain polymer patterns may not be oriented perpendicularly to the substrate. Generally speaking, these assembly defects concern isolated guides, where the thickness of block copolymer is the greatest.

Thus, since the thickness of the block copolymer layer varies within the guiding patterns of a same substrate (for example according to their density), it is rare to obtain the assembly and the transfer of all the secondary patterns with the same performances, especially in terms of critical dimension.

SUMMARY

It therefore exists a need to provide a method for making final patterns on the surface of a substrate by block copolymer self-assembly which is independent of the configuration of the assembly guide, that is to say a method which makes it possible to obtain patterns with the same performances whatever the distribution and the dimensions of the guiding patterns.

According to an aspect of the invention, this need tends to be satisfied by providing the following steps:

forming an assembly guide on first and second areas of the substrate, the assembly guide having, compared to a reference surface, openings with an opening ratio in the first area greater than that of the second area;

depositing a block copolymer layer on the substrate, such that the block copolymer layer entirely fills the assembly guide and forms an over-thickness on the reference surface;

assembling the block copolymer, resulting in an organised portion of the block copolymer layer inside the openings of the assembly guide;

thinning uniformly the block copolymer layer, until a thickness corresponding to the organised portion of the block copolymer layer is reached;

eliminating one of the phases of the assembled block copolymer, resulting in a plurality of initial patterns extending into the layer of block copolymer; and transferring the initial patterns of the block copolymer layer into the substrate to form said final patterns.

The assembly guide may designate a layer (or a stack of several layers) in which are formed openings, or cavities, for example by photolithography. According to an embodiment variant, the guide may be formed in the form of openings directly in the substrate. These openings form the guiding patterns in which the block copolymer is deposited.

"Opening ratio of the assembly guide" herein designates the ratio between the surface area of the openings in the guide, and the total surface of a field containing these openings, for example 2 µm×2 µm. When all of the openings of the guiding patterns of the substrate have the same surface area, an opening ratio in a first area of the substrate higher than that in a second area of the substrate is equivalent to a higher density of openings in the first area than in the second area. It is also possible to attain a higher opening ratio in the first area, without necessarily the number of openings being higher there, when the openings of the first area have bigger surface areas than those of the second area.

The step of deposition, hereafter called "planarization step", makes it possible to obtain a block copolymer layer, which extends beyond the assembly guide (forming an over-thickness above the upper face of the guide, called reference surface) and the surface of which is substantially flat.

After the step of assembly of the block copolymer, a portion of the block copolymer layer situated inside the openings of the assembly guide is found organised according to the desired pattern. Generally speaking, it is sought to obtain patterns oriented perpendicularly to the plane of the substrate and, beneficially, arranged in a periodic manner. The remaining portion of the block copolymer layer (i.e. the over-thickness) may be oriented or not (i.e. disorganised). If it is oriented, it may be oriented along the same direction as the patterns of the organised portion or another orientation. The remaining portion in general consists of defects. What is meant by "defect" is any rupture of the periodic network. These defects are erased by uniformly thinning the block copolymer layer, to only conserve copolymer correctly organised at the bottom of the guide.

Thus, thanks to the step of planarization, followed by the step of assembly and the step of thinning, an organised layer of copolymer of same thickness is obtained in all the guiding patterns of the substrate, whatever their size and their distribution in the first and second areas. It is then possible to remove one of the blocks of organised copolymer and to transfer the patterns generated by this removal into the substrate in the same manner for all the guiding patterns, unlike methods of the prior art where there is no step of planarization, or step of thinning.

The portion of layer that is not situated inside the openings of the assembly guide and organised according to the desired pattern—in which the domains of copolymer are any, for example oriented parallel to the substrate (and not perpendicularly)—, is without effect on the transfer, since this is eliminated beforehand during the step of thinning.

The step of thinning of the block copolymer layer, carried out for example by plasma etching and/or by chemical mechanical planarization, takes place beneficially after the step of assembly of the copolymer. Thus, the blocks of monomer are separated and freezed during the step of thinning of the layer. Consequently there is no risk of disrupting the organisation of the domains of the copolymer. The step of thinning may nevertheless be carried out before the assembly step or instead in part before and in part after.

The step of thinning and the step of elimination of one of the phases of the assembled block copolymer are beneficially carried out in a same plasma etching apparatus, either simultaneously using a single plasma selected from $Ar/O_2$, $C_xF_y$, $SF_6$, $N_2/H_2$, $CO/O_2$, $CO/H_2$, $CH_4/O_2$, $C_xF_y/O_2$, $CH_xF_y/O_2$, $C_xF_y/H_2$, $CH_xF_y/H_2$ and $C_xH_y/H_2$, or by a succession of steps using plasmas of different types or by alternation of at least two plasmas.

In an embodiment, the deposition of the block copolymer layer is carried out by spin coating.

The method according to an embodiment of the invention may also have one or more of the characteristics below, considered individually or according to any technically possible combinations thereof:

the assembly guide is formed of a mask arranged on the substrate and textured by photolithography and/or etching or made directly in the substrate by photolithography and/or etching;

this mask comprises a first carbonaceous layer in contact with the substrate and a second anti-reflective silicon rich layer arranged on the first carbonaceous layer, said anti-reflective silicon rich layer serving as stop layer during the thinning of the assembled block copolymer layer;

the assembly guide comprises a plurality of openings forming guiding patterns distributed between the first and second areas of the substrate;

the guiding patterns have a height comprised between 5 nm and 1000 nm;

the surface of the guiding patterns has a particular affinity for one or more of the blocks of the block copolymer;

the bottom of the guiding patterns is neutral compared to the blocks of the block copolymer whereas the sides of the guiding patterns have a particular affinity for one or more of the blocks of the block copolymer;

the surface of the guiding patterns is neutral compared to the blocks of the block copolymer;

the particular affinity of the assembly guide for one or more blocks of the block copolymer is obtained by grafting of one or more homopolymers; and the neutralisation of the assembly guide is obtained by grafting of a random copolymer.

BRIEF DESCRIPTION OF THE FIGURES

Other characteristics and benefits of the invention will become clear from the description which is given thereof below, by way of indication and in no way limiting, with reference to the appended figures, among which.

For greater clarity, identical or similar elements are marked by identical reference signs in all of the figures.

DETAILED DESCRIPTION

An embodiment of the method according to the invention will now be described with reference to FIGS. 1A to 1G.

Figure 1A:
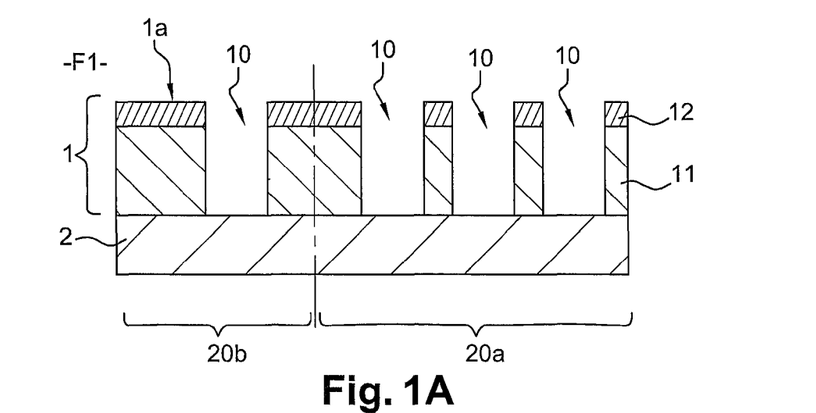
FIGS. 1A to 1G represent sectional views of the steps of a method for making patterns on the surface of a substrate, according to an implementation of the invention.

The method firstly comprises a step F1 represented in FIG. 1A during which an assembly guide 1 is formed on the surface of a substrate 2. The assembly guide 1 comprises openings 10 which extend from the upper face 1a of the guide to the substrate 2. These openings 10 correspond to the guiding patterns in which the block copolymer will be deposited.

The substrate 2 comprises at least two areas 20a and 20b on which are distributed the guiding patterns 10.

The distribution of the patterns 10 within the assembly guide 1 is such that the guide has an opening ratio in area 20a greater than that in area 20b. In the example of FIG. 1A, this is shown schematically by three openings 10 in area 20a, whereas area 20b only counts a single one thereof, all the openings 10 having substantially the same dimensions. Here, it is thus wished to form three times more patterns in area 20a than in area 20b.

An area 20a comprising as many openings 10 as area 20b could also be envisaged, but openings for which the dimensions are greater than those of area 20b. This case arises especially when it is wished to form, on a same substrate, several patterns (for example contact holes) per opening 10 in area 20a ("contact multiplication") and a single pattern per opening in area 20b ("contact shrinking").

The assembly guide 1 may be formed of a hard mask that covers the substrate and is composed of one or more layers. The guiding patterns 10 in the mask are then obtained by etching of these different layers. Typically, a layer of resin is deposited on the hard mask, then printed by means of photolithography (at a wavelength of 193 nm for example), extreme ultraviolet (EUV) lithography, electron beam ("e-beam") lithography or any other lithography technique (nano-printing, multiple exposure photolithography . . . ). Then, the guiding patterns printed in the resin are transferred by etching into the layers of the hard mask.

In an embodiment, the hard mask is a bilayer stack comprising a first carbonaceous layer 11 ("Spin On Carbon", SOC), in contact with the substrate 2, and a second anti-reflective layer 12 arranged on the carbonaceous layer 11. The anti-reflective layer 12 is, for example, a silicon rich coating ("Silicon Anti-Reflective Coating", SiARC). This bilayer stack makes it possible especially to adapt the optical refractive index of the substrate, avoiding the creation of stationary waves during the step of photolithography, and has good selectivity with regard to the etching of the block copolymer.

In an embodiment variant (not represented), the assembly guide may be formed of a resin layer arranged directly on the substrate, the guiding patterns having been printed in the resin by means of any one of the aforementioned lithography techniques, for example by photolithography (exposure and development of part of the resin). This resin may especially be a negative tone development resist resin. A solvent is then used to remove the non-exposed regions of the resin, whereas the exposed regions remain on the substrate.

As viewed from above, the guiding patterns 10 of the guide 1 may have different shapes, especially rectangular, circular or elliptical, and variable repetition steps or pitches, in order to obtain a reduction and/or a multiplication of the contact holes ("contact shrink" and/or "contact multiplication").

They can also form networks of lines. The thickness of the guide 1, that is to say the height of the patterns 10, is benficially comprised between 5 nm and 1000 nm, typically between 20 nm and 300 nm.

Figure 1B:
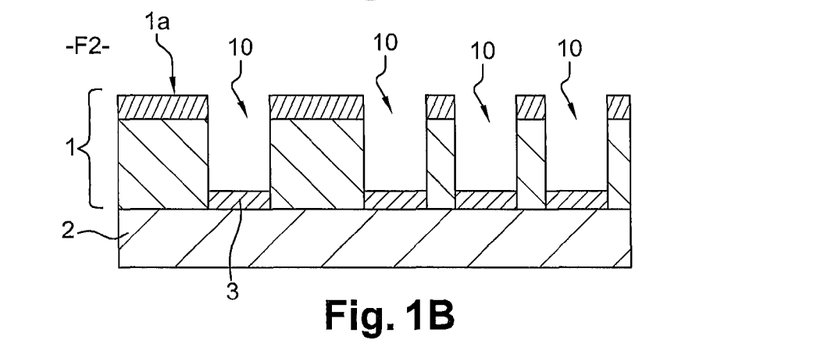

In this embodiment, a step of surface preparation may be carried out to favour the arrangement of the domains of the block copolymer, for example perpendicular to the surface on which it will be deposited. This optional step F2 is represented in FIG. 1B.

Three modes of preparation may be envisaged to obtain three types of configuration:

the whole of the surface of the cavities 10 has a particular affinity for one or more of the blocks of the copolymer;

the sides of the cavities 10 have a particular affinity for one or more of the blocks of the copolymer and the bottom of the cavities 10 is neutral compared to the blocks of the copolymer;

the whole of the surface of the cavities 10 is neutral compared to the blocks of the copolymer.

So that a surface has a particular affinity with respect to one or more blocks of copolymer, it is possible to graft thereon one or more suitable homopolymers. Surface neutralisation may for its part be obtained by grafting a random copolymer. As may be seen in FIG. 2, a homopolymer or random copolymer layer 3 is then grafted onto the bottom and/or the side walls of the guiding patterns 10. The grafted layer 3 typically has a thickness of 2 nm to 20 nm. The grafting of the layer 3 takes place conventionally in three steps: deposition of the material (homopolymer or random copolymer), annealing and rinsing.

Other ways of neutralising the substrate may be envisaged, especially by plasma treatment, UV treatment, ionic implantation or deposition of a self-assembled monolayer (SAM). The substrate may also be chosen so as to favour the arrangement of the domains of copolymer. It is thus not obligatory to use a neutralisation layer.

Figure 1C:
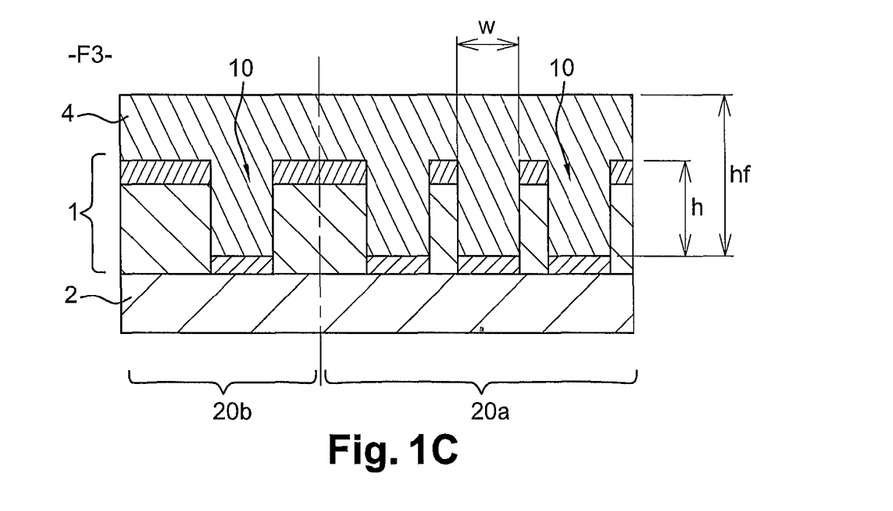

At step F3 of FIG. 1C, a block copolymer layer 4 is deposited in the assembly guide 1. The difference in opening ratio of the assembly guide in several areas of the substrate causes, in the method of the prior art, a difference in thickness of the copolymer layer inside the guide. Conversely, in the method of FIGS. 1A to 1F, the deposition conditions are chosen so that the block copolymer layer 4 has, in each area 20a, 20b of the substrate, substantially the same thickness. This requires that the layer 4 extends beyond the assembly guide 1. Thus, the guiding patterns 10 are not only entirely filled, but moreover, the block copolymer layer 4 is in over-thickness above the guide 1.

Yet, in conventional direct self-assembly (DSA) methods, depositing a layer of too high thickness is avoided because, as will be described hereafter, the assembly of a block copolymer outside of a guide causes orientation defects.

The block copolymer of the layer 4 may be a two-block copolymer (two monomers A and B) or multi-block (more than two monomers), a mixture of polymers, a mixture of copolymers or instead the mixture of a copolymer and a homopolymer. It may be of any morphology, for example spherical, cylindrical, gyroidal, lamellar . . . , according to the proportion between the blocks of monomer.

The material of the layer 4 is, for example, a two-block copolymer containing a styrene derivative (typically polystyrene, PS) and a methacrylate derivative (typically polymethylmethacrylate, PMMA). With 30% by weight of PMMA and 70% by weight of PS, the domains of PMMA are, after assembly, in the form of cylinders contained in a PS matrix. Obviously, other proportions between the monomers may be envisaged, in order to obtain domains of different geometry (lamellar, spherical . . . ).

The deposition of the block copolymer layer is, in an embodiment, carried out by spin coating. A solution containing a solvent (for example toluene or propylene glycol monomethyl ether acetate (PGMEA)) and the copolymer material (for example PS-b-PMMA) is spread over the substrate, by centrifugal force. This mode of deposition is particularly adapted to levelling surface topography, such as that generated by the cavities of the assembly guide 1 on the substrate 2.

The planarization of surface topography by spin coating has been the subject of numerous studies. In particular, in the article ["Planarization of Substrate Topography by Spin Coating", J. Electrochem. Soc. 1987 volume 134, issue 8, 2030-2037], L. E. Stillwagon et al. have demonstrated that the efficiency of this planarization depends on the dimensions of the cavity to be filled (cf. FIG. 1C, width w and height h), on the thickness ($h_f$) of the polymer film deposited and on the polymer viscosity. According to L. E. Stillwagon et al., the surface becomes flat when the capillarity forces are equal to the centrifugal force while the spin coater operates. A critical width of cavity $w_c$ may thus be defined below which the surface of polymer is flat immediately after spin coating. This critical width is written:

$$w_c = \left(\frac{16\gamma h}{\rho \omega^2 r}\right)^{\frac{1}{3}} \quad (1)$$

where $\gamma$ is the surface tension, h is the height of the cavity, $\rho$ the polymer density, $\omega$ the rotational speed of the substrate and r the radial position of the cavity on the substrate.

Thus, all of the cavities having a width below the critical width $w_c$ may be levelled by spin coating. It may be concluded therefrom that a narrow cavity (low w) is easier to level than a wide cavity (high w). Furthermore, a dense field of patterns 10 may be considered during spin coating as a single and wide cavity. In the example of assembly guide of FIG. 1C, the three patterns 10 of the area 20a are sufficiently close together to be viewed as a single cavity of dimensions three times greater than the pattern 10 of the area 20b. It is thus easier to level isolated contacts, such as the pattern 10 of the area 20b, than a dense field of patterns (area 20a).

The above equation (1) does not take into account the viscosity of the polymer material, because it is based on the hypothesis that the material deposited with the spin coater is a Newtonian fluid, that is to say a fluid for which the viscosity does not vary either with deformation speed, or with time. According to L. E. Stillwagon et al., a second equation may then be introduced to take into account the fact that the response of a polymer material subjected to a force may be spread out over time. This equation defines the time $t_p$ necessary to completely fill the cavity with a viscous polymer material after stopping the spin coater and is written:

$$t_p = \frac{3}{32} \frac{\omega^4 \eta}{\gamma h_f^3} \quad (2)$$

where $\omega$ is the rotational speed of the substrate, $\eta$ the viscosity of the polymer, $\gamma$ the surface tension and $h_f$ the thickness of the film of polymer deposited on the substrate.

It is noted that the more viscous the polymer material (high $\eta$), the greater the waiting time $t_p$. Moreover, the waiting time $t_p$ increases when the thickness of the deposited layer decreases. It is thus difficult to obtain a thin flat layer with a highly viscous material by spin coating.

Thanks to the teaching of this article, and given the application envisaged here, it is possible to form a block copolymer layer 4 of substantially identical thickness on all areas of the substrate, including the areas 20a and 20b having different opening ratios. The viscosity of the solution containing the block copolymer is in fact low (close to that of the dissolution solvent), for example below 1.3 cP. Moreover, the thicknesses of the layer 4 deposited at step F3 are much greater than in the method of the prior art (because the guide 1 is exceeded), such that the flat layer 4 may be obtained almost instantaneously after stopping the spin coater.

The thickness of the copolymer layer 4 deposited on the substrate 2 is beneficially comprised between 1 time and 2 times the thickness of the assembly guide 1. The deposition conditions, such as the rotational speed, the weight percentage of block copolymer in the deposition solution and the rotation time, could be determined empirically, because the amount of copolymer required to entirely fill the guide obviously depends on the number and on the size of the guiding patterns 10 formed on the substrate, in particular their height. Various morphological characterisation techniques, such as the profilometer, make it possible to check that the layer 4 is flat on the surface, synonymous with all the guiding patterns 10 being filled. Several examples of these deposition conditions will be given hereafter.

The degree of planarization obtained as a function of the thickness of block copolymer deposited has been studied, especially in the article ["A Parametric Study of Spin Coating over Topography", Ind. Eng. Chem. Res., Vol. 37, No. 6, pp. 2223-2227, 1998]. For step F3 of FIG. 1C, the planarity of the block copolymer layer 4 is considered satisfactory when the degree of planarization (as defined in this article) is above 50%, and in an embodiment above 75%.

The conditions for obtaining and controlling the deposited thickness can be determined from experimental laws giving:
- the thickness of a polymer film as a function of the rotational speed, for a given viscosity;
- the thickness of the film as a function of the polymer concentration in the deposition solution; and
- the viscosity as a function of the polymer concentration in the solution.

These laws may be taken from the article ["Characteristics of resist films produced by spinning", J. Appl. Phys., Vol. 49, No. 7, July 1978].

Figure 1D:
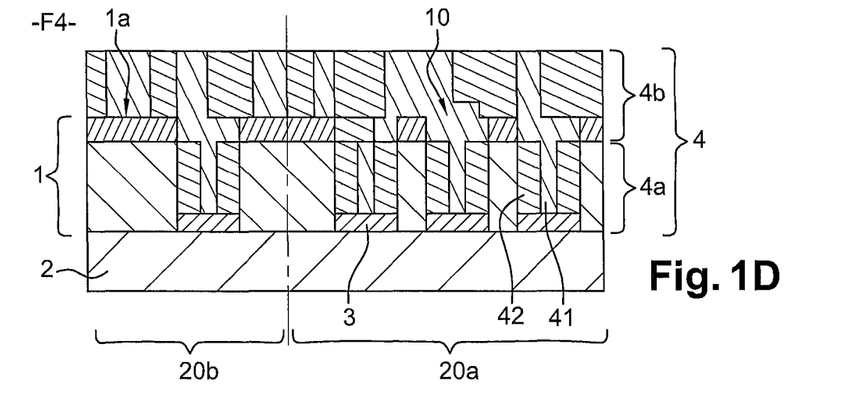

FIG. 1D represents the step of assembly F4 of the block copolymer, after the deposition of the layer 4 at step F3. After assembly, two portions of the copolymer layer may be distinguished: a portion 4a situated at the bottom of the assembly guide 1 and a portion 4b situated on the portion 4a and corresponding substantially to the over-thickness of the copolymer layer 4 above the assembly guide 1.

In the portion 4b, the domains of the copolymer (here PS-b-PMMA) are generally poorly oriented. The domains of PMMA and PS may be laid out randomly. For example surface defects of mixed orientation type are observed, that is to say a mixture of cylinders of PMMA oriented in parallel and perpendicularly to the substrate 2.

However, in a surprising manner, the domains of the PMMA block and the PS block in the portion 4a are correctly oriented. With the example of copolymer mentioned above, the domains of PMMA are in the form of cylinders 41 perpendicular to the substrate 2, each cylinder 41 being surrounded by a matrix 42 of polystyrene.

As is the case in FIG. 1D, the upper face of the organised portion 4a may not correspond to the surface of the assembly guide 1 (reference surface 1a). For example, for an assembly guide 1 formed of a SiARC/SOC stack of 125 nm thickness, the organised portion 4a of the layer of PS-b-PMMA copolymer will reach 70 nm thickness.

The self-assembly of the blocks is, in an embodiment, carried out by means of heat treatment or annealing. The annealing temperature and time are optimised as a function of the thickness of the copolymer layer 4. The thicker the layer 4, the longer the annealing time and/or the higher the annealing temperature. For example, for a layer thickness of about 50 nm, an annealing of 2 min at 250° C. may be carried out in the case of a PS-b-PMMA copolymer of period of about 35 nm. The assembly of the block copolymer may alternatively be obtained by an ultrasound treatment or by an operation called solvent annealing, rather than heat treatment, or instead by a combination of these two techniques, or instead by any other technique known to those skilled in the art.

Figure 1E:
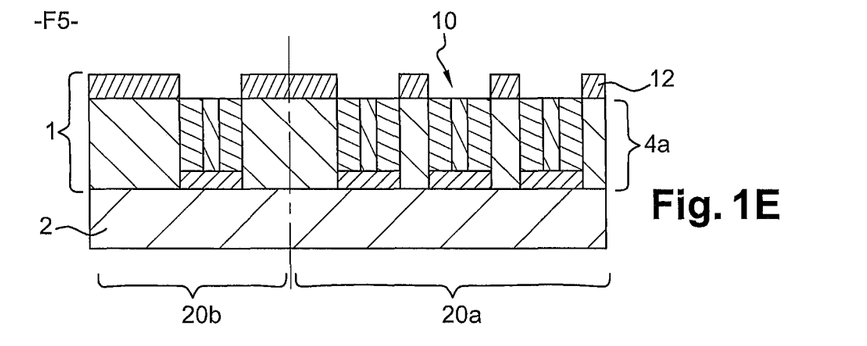

Step F5 of FIG. 1E consists in etching the portion 4b of the copolymer layer situated on the surface of the assembly guide 1, until the organised portion 4a situated inside the guide 1 is reached. This etching is carried out in a directional and uniform manner on the wafer such that the layer of copolymer thereby thinned has the same thickness at all points of the substrate 2, and thus in the areas 20a and 20b where the distribution and/or the dimensions of the guiding patterns 10 differ. For example, an anisotropic etching may be carried out.

In an embodiment of step F5, the thinning of the block copolymer layer 4 is carried out by chemical mechanical planarization (CMP).

In an embodiment variant, the thinning of the layer of copolymer 4 is carried out by plasma etching. The SiARC layer 12 can serve as an etching stop layer. Therefore, it allows to better control thinning and avoids deterioration of the guiding patterns 10. In the case of an integration where the guide does not enable to be used as a stop layer (example of the resin guide), it is possible to create this stop layer before depositing the block copolymer, for example by densifying the resin making the guide or by depositing an oxide onto the guide. Depositing the oxide can be made by different deposition techniques (PECVD, ALD, PEALD . . . ) in order to be compatible with the material making the guide in terms of deposition temperature. By way of example, a layer of silicon dioxide $SiO_2$ can be deposited onto the resin guide by PEALD ("Plasma-Enhanced Atomic Layer Deposition") at a temperature of 50° C. or the guide resin can be densified for 50 seconds by HBr plasma (100 sccm) under a pressure of 5mTorr and with a power of 1200 W. The oxide is a readily integratable material but it can be replaced with any other material playing the role of stop layer upon thinning the polymer and the deposition of which is compatible with the guide.

The gases that could be used to etch the block copolymers are, for example, $O_2$, CO, $CO_2$, $H_2$, $N_2$ . . . . These gases may be combined together (e.g. $CO/O_2$, $CO/H_2$ . . . ) or with other inert gases (e.g. $Ar/O_2$, $Ar/N_2$, $He/O_2$ . . . ), polymerising gases (i.e. carbonaceous, e.g. $CH_4/O_2$) or fluorinated gases ($C_xF_y/O_2$, $CH_xF_y/O_2$, $C_xF_y/H_2$, $CH_xF_y/H_2$ . . . ). A mixture of several types of gas may also be used, as well as other gas chemistries: $C_xF_y$, $SF_6$ . . . .

For example, the plasma is generated from a mixture of $Ar/O_2$ gas, under a pressure of 10 mTorr, with a power of 220 W and a polarisation voltage of 100 V. The amount of oxygen represents between 9% and 100% of the mixture. It is thus possible to etch the PS-b-PMMA copolymer selectively compared to the SiARC (a selectivity above 20, for example of the order of 40, may thus be attained).

Unlike chemical mechanical planarization, plasma etching has the benefit of etching the copolymer without deteriorating the assembly guide 1. In fact, given that the organised portion 4a of the block copolymer lies inside the guide 1, chemical mechanical planarization has the effect of planing down the guide at the same time as the block copolymer to reach the desired thickness, for example 70 nm in a guide of 125 nm height. Conversely, a plasma etching method may leave intact the assembly guide, due to its great selectivity compared to the material(s) that constitute the assembly guide.

Finally, in another alternative embodiment, thinning the copolymer layer is made by a wet method, assisted or not with an ultraviolet exposure. Liquid solutions enabling block copolymers to be etched are solvents, as PGMEA, toluene and cyclohexane. The chosen solution does not etch the assembly guide. In order to best control the thinning and thickness of the block copolymer remaining in the guide, the surface of the copolymer layer can be modified beforehand by a plasma using a gas as He, Ar, HBr, $N_2$, $CH_4$, CO, $H_2$, $C_xF_y$, $C_xH_y$, $CH_xF_y$, . . . or a combination of several of these gases (ex. $Ar/H_2$, $He/CH_4$). The plasma modified part is then selectively removed by a wet method leaving in the guide only the unmodified part. For example, the chemical modification plasma is generated from an Ar gas under a pressure of 10 mTorr, with a power of 500 W and a bias voltage of 300 V.

Still for the sake of best controlling the thinning and thickness of the block copolymer remaining in the guide, several plasma etching and wet-etching steps can alternate in order to have a precise etching of the copolymer layer. This approach takes in the principle of new ALE ("Atomic Layer Etching") etching techniques, which rely on plasma etching/deposition cycles or plasma/wet etching cycles, on the use of pulsed gas or the use of a RF voltage during the plasma etching. All these techniques can be used in the thinning steps in order to have a better control on the etched thickness of the block copolymer and that remaining in the guide.

It is desirable, in the case of thinning by plasma etching especially, to carry out the assembly of the block copolymer before the thinning of the layer 4, and not after, because the thinning could alter one of the two phases of the copolymer, such that it becomes difficult to separate these two phases.

The method then comprises a step F6 (cf. FIG. 1F) of eliminating one of the phases of the assembled block copolymer layer, here the cylinders of PMMA 41. To do so, the remaining portion 4a of the block copolymer layer may be immersed in 99% concentrated acetic acid for 10 minutes. A prior UV exposure may also be carried out.

Figure 1F:
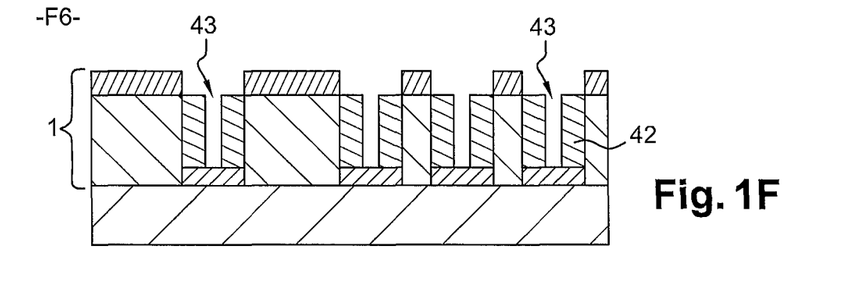

Patterns 43 are then obtained in a residual layer 42 composed only of the other phase of the copolymer, polystyrene. The resolution of these secondary patterns 43 is very high, because of the same order of magnitude as the domains of PMMA.

In an embodiment, the removal of the cylinders of PMMA (step F6) is carried out in the same plasma etching apparatus as the thinning of the copolymer layer (step F5).

A first strategy is to perform both steps simultaneously, using a single plasma with gas mixtures (reactive/inert gas or reactive/polymerizing gas) such as $Ar/O_2$, $C_xF_y$, $SF_6$, $N_2/H_2$, $CO/O_2$, $CO/H_2$, $CH_4/O_2$, $C_xF_y/O_2$, $CH_xF_y/O_2$, $C_xF_y/H_2$, $CH_xF_y/H_2$ and $C_xH_y/H_2$. To be able to perform both these steps with the same plasma, the selectivity between polystyrene and PMMA during this etching will be beneficially between 1 and 5.

A second strategy consists in carrying out several successive etching steps within a same equipment, for firstly thinning the block copolymer layer, then removing the PMMA selectively compared to PS, with different etching chemistries between the two steps. As an example, the thinning can be carried out using a $CF_4$ plasma (no selectivity between PMMA and PS) then removing the PMMA using a $CO/O_2$ plasma (selectivity PMMA/PS>10), which allows to control independently the thinning and the removal of the PMMA by plasma etching. An alternation of at least two plasmas may also be carried out to further improve this control, that is to say by carrying out successive etching cycles (for example Ar, $Ar/O_2$, Ar . . . or $CF_4$, $CO/H_2$, $CF_4$ . . . or CO, $CO/H_2$, CO . . . ).

Although this approach is less beneficial, the two steps F5 and F6 may employ two different tools. The thinning of the copolymer layer may be carried out with a plasma without selectivity over SiARC, PMMA or PS, using especially fluorinated chemistries (e.g. $CF_4$), whereas the removal of the PMMA is carried out by methods other than plasma etching, for example by wet method.

Figure 1G:
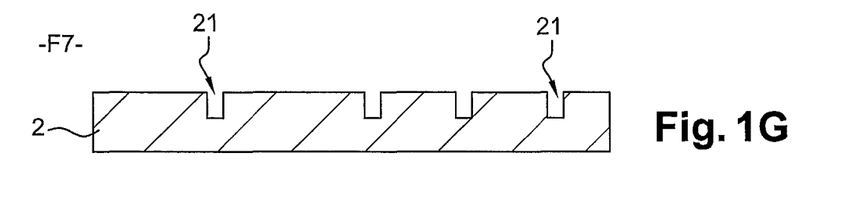

Finally, at step F7 of FIG. 1G, the patterns 43 in the polystyrene layer 42 are transferred into the underlying substrate 2. The desired patterns 21 (contact holes to form vias, trenches to form metal lines . . . ) are then obtained on the surface of the substrate 2. This transfer uses the polystyrene layer 42 and the assembly guide 1 as etching mask. In other words, only the portions of the substrate 2 situated directly in line with the holes 43 are etched. The polystyrene 42 and the assembly guide 1 are then eliminated to only conserve the substrate 2 etched at the level of the openings of the guide.

Tests have been carried out on a substrate provided with an assembly guide having a height of about 125 nm and a variable opening ratio. The guiding patterns considered are single size cylinders. The opening ratio, which is thus here equivalent to a pattern density $$\left(\text{density} - \frac{\pi}{4}\left(\frac{CD}{d}\right)^2\right),$$

where CD is the diameter of the cylinders and d is the distance between two consecutive cylinders) is equal to 0.01, 0.04 or 0.2 according to the area of the substrate (i.e. respectively 1, 4 or 16 guiding patterns distributed on a same field of 2 μm×2 μm).

For these tests, different conditions of deposition of the copolymer by spin-coating have been envisaged:
 conditions of test no 1: rotational speed of about 2000 rpm, 0.5 wt. % of copolymer in the deposition solution and rotation time of about 20 s;
 conditions of test no 2: rotational speed of about 1000 rpm, 1.5 wt. % of copolymer in the deposition solution and rotation time of about 20 s; and
 conditions of test no 3: rotational speed of about 1000 rpm, 3 wt. % of copolymer in the deposition solution and rotation time of around 20 s.

As a comparison, the same copolymer has been spread with the same deposition conditions on reference substrates without guiding patterns, to determine the equivalent thickness of copolymer on a topography-free surface.

In the conditions of test no 1, the equivalent thickness of the copolymer layer (measurable on the reference substrate, for example by ellipsometry) is about 12 nm. On the substrate with the assembly guide, it is observed with scanning electron microscope that certain guiding patterns are not entirely filled by the copolymer material. The deposited amount of copolymer is thus insufficient and a flat layer is not attained.

This first test reflects the conditions of obtaining patterns according to the method of the prior art (where there is no planarization step, or thinning step). The thickness values obtained in the guide after assembly differ according to the density of the guiding patterns: typically 120 nm for a patterns density of 0.01, 120 nm for a density of 0.04 and 50 nm for a density of 0.2 (AFM measurements).

In the conditions of test no 2, the equivalent thickness of the copolymer layer is about 50 nm and all the guiding patterns are entirely covered by the block copolymer. A step of thinning, by $Ar/O_2$ plasma, follows the spin coating and the assembly of the copolymer. It comprises a first step of etching of about 20 s to reach the surface of the guide (i.e. the SiARC layer) then a second step, called over-etching, of about 5 s to reach the organised portion of the copolymer layer.

After assembly and thinning, the assembled block copolymer layer of in the guide is 110 nm thick where the density of the guiding patterns is equal to 0.01, 100 nm thick where the density is equal to 0.04 and 85 nm thick where the density is equal to 0.2 (AFM measurements).

Finally, in the conditions of test no 3, the equivalent thickness of the copolymer layer is about 120 nm. All the patterns are also buried by the block copolymer material. The operation of thinning that follows the assembly is identical to that described in test no 2, except as regards the duration of the two etching steps: about 46 s for the first step and 12 s for the second step of over-etching. It may be noted in the AFM images that, after assembly and thinning, the thickness of the block copolymer layer is identical in all the areas of the assembly guide, that is to say whatever the density of the guiding patterns. It is approximately equal to 70 nm.

Figure 2:
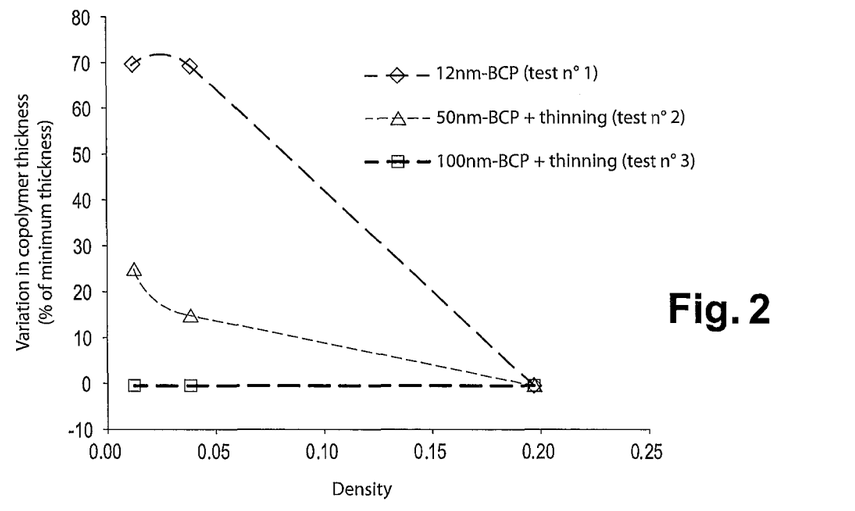
FIG. 2 represents the thickness variation of block copolymer within an assembly guide as a function of the density of the patterns in the guide, after the step of deposition according to a method of the prior art (test no 1) and after the step of thinning of the method according to an embodiment of the invention (tests no 2 and 3)

FIG. 2 is a graph grouping together the results of the above tests. It shows the thickness variation of the block copolymer inside the assembly guide (in percentage of the lowest thickness obtained, i.e. in the densest patterns—density=0.2), according to the density of the guiding patterns. The upper curve corresponds to test no 1, that is to say to conventional conditions of spin coating (without planarization). The other two curves correspond to tests no 2 and no 3, which apply the steps of FIGS. 1C and 1E (planarization and thinning).

It may be noted on this graph that the method according to an embodiment of the invention allows to limit in a significant manner the thickness variation within an assembly guide of variable density. Indeed, by depositing the equivalent of a layer of 50 nm thickness, the thickness variation within the guide only reaches 30% (middle curve), compared to 70% in the method of the prior art (upper curve). By depositing the equivalent of a layer of 120 nm thickness, a uniform thickness (i.e. a zero variation) may be reached. This homogeneity of thickness, obtained thanks to the combination of steps of planarization and thinning, will make it possible to transfer by etching not just dense contact holes but also isolated contact holes, with a minimum of defects (missing or over-etched contacts).

The difference between the curve of equivalent thickness 50 nm and the curve of equivalent thickness 120 nm is explained by the fact that a better planarity is obtained in the second case (higher thickness; cf. equation no 2). Nevertheless, as discussed previously, a clear improvement in the final thickness of the assembled copolymer is already noted (and thus in the subsequent transfer of the patterns) from 50 nm. Consequently, the deposition conditions could be chosen to deposit a block copolymer layer having an equivalent thickness above 50 nm and, in an embodiment, above 120 nm.

Figure 3A:
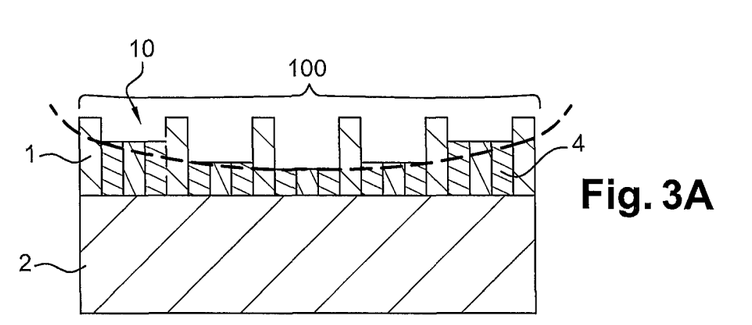
FIGS. 3A and 3B schematically represent a layer of block copolymer within an assembly guide, respectively after the step of deposition according to a method of the prior art and after the step of thinning of the method according to the invention.
Figure 3B:
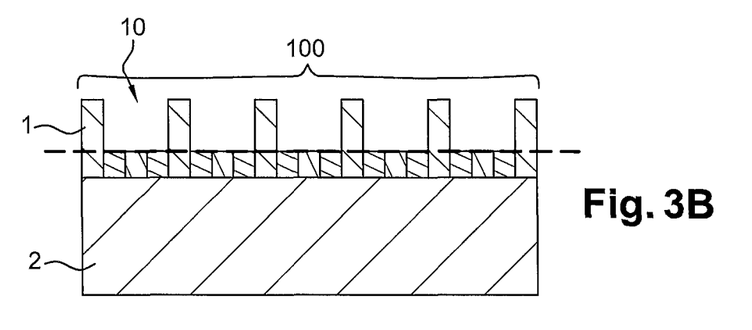

As is illustrated in FIG. 3A, the method for making patterns according to the prior art causes, after spin coating, a higher thickness of copolymer on the edges of a pattern field 100 than in the centre of this same field, because there exists locally a rupture of the density of the guiding patterns 10 (this density drops suddenly to zero beyond the field 100). Yet, this difference in thickness normally causes the appearance of undesirable patterns at the edge of field 100. Conversely, in FIG. 3B, the thickness obtained after the step of thinning of FIG. 1E is uniform, not just at the centre of the pattern field 100 but also on its edges. The method according to an embodiment of the invention thus has the benefit of being free of this edge effect.

It will be appreciated that the method for making patterns according to an embodiment of the invention is not limited to the embodiment that has just been described with reference to FIGS. 1A to 1G and numerous variants may be envisaged.

For example, the spreading of the block copolymer layer at step F3 (FIG. 1C) may be obtained otherwise than by spin coating, for example by chemical vapour deposition (CVD) or any other technique known to those skilled in the art.

Even though this solution is less beneficial, it is possible to perform thinning of the block copolymer layer before it is assembled. In this case, the thickness of the block copolymer layer is reduced until a thickness which corresponds to the future organized portion of the block copolymer is reached.

Prior tests will allow to determine below which height the organized portion of copolymer is located, and thus how far the copolymer layer is to be thinned.

The thinning could also be provided in two steps, being successive or timely separated by the step of assembling the block copolymer. In other words, the first of these steps can be made before assembling the block copolymer and the second step after assembling. For example, an aggressive etching technique will be used during the first step, in order to "rough" the copolymer layer, and a less aggressive etching technique for the second step, in order to obtain a thin copolymer layer with a better surface state (i.e. smoother). Besides, the different thinning modes described above (CMP, plasma etching, wet etching) can be combined, for example CMP for the first step and plasma etching for the second step.

Moreover, materials other than those cited previously may be used, especially for the block copolymer layer, for example PS-b-PLA: polystyrene-block-polylactic acid, PS-b-PEO: polystyrene-block-polyethylene oxide, PS-b-PDMS: polystyrene-block-polydimethylsiloxane, PS-b-PMMA-b-PEO: polystyrene-block-polymethylmethacrylate-block-polyethylene oxide, PS-b-P2VP: polystyrene-block-poly(2vinylpyridine). Similarly, the hard mask in which the assembly guide is formed may be made of titanium nitride (TiN), silicon nitride (SiN) and/or silicon dioxide ($SiO_2$), rather than a SiARC/SOC stack. The number and the thickness of the hard mask layers are also subject to variations, depending on the nature of the block copolymer and the etching techniques used. Furthermore, an integration of the block copolymer directly in a resin mask may also be envisaged.

Finally, the steps of planarization and thinning described above may be employed in a hybrid integration combining grapho-epitaxy and chemi-epitaxy, in so far as the substrate has a topography—even very slight (greater than 5 nm)—enabling the assembly of the block copolymer.

The invention claimed is:

1. A method for producing final patterns on a surface of a substrate by self-assembly of block copolymer, comprising:
   forming an assembly guide on first and second areas of the substrate, the assembly guide having, compared to a reference surface, openings with an opening ratio in the first area greater than that of the second area;
   depositing a layer of block copolymer on the substrate, such that the block copolymer layer entirely fills the assembly guide and forms an over-thickness on the reference surface;
   assembling the block copolymer, resulting in an organised portion of the block copolymer layer inside the openings of the assembly guide;
   thinning uniformly the block copolymer layer, until a thickness corresponding to the organised portion of the block copolymer layer is reached;
   eliminating one of the phases of the assembled block copolymer, resulting in a plurality of initial patterns extending into the block copolymer layer; and
   transferring the initial patterns of the block copolymer layer into the substrate to form said final patterns.

2. The method according to claim 1, wherein the deposition of the block copolymer layer is carried out by spin coating.

3. The method according to claim 1, wherein the block copolymer contains at least one styrene derivative and one methacrylate derivative.

4. The method according to claim 1, wherein the thinning of the block copolymer layer is carried out by plasma etching.

5. The method according to claim 4, wherein the thinning of the block copolymer layer and the elimination of one of the phases of the assembled block copolymer are carried out in a same plasma etching apparatus.

6. The method according to claim 5, wherein the thinning of the block copolymer layer and the elimination of one of the phases of the assembled block copolymer are carried out simultaneously using a single plasma selected from $Ar/O_2$, $SF_6$, $C_xF_y$, $N_2/H_2$, $CO/O_2$, $CO/H_2$, $CH_4/O_2$, $C_xF_y/O_2$, $CH_xF_y/O_2$, $C_xF_y/H_2$, $CH_xF_y/H_2$ and $C_xH_y/H_2$.

7. The method according to claim 5, wherein the thinning of the block copolymer layer and the elimination of one of the phases of the assembled block copolymer are carried out by a succession of steps using plasmas of different types or by alternation of at least two plasmas.

8. The method according to claim 1, wherein the thinning of the layer of copolymer is carried out by chemical mechanical planarization.

9. The method according to claim 1, wherein the assembly guide is formed of a mask arranged on the substrate and textured by photolithography and/or etching.

10. The method according to claim 9, wherein the mask comprises a first carbonaceous layer in contact with the substrate and a second anti-reflective silicon rich layer arranged on the first carbonaceous layer, said anti-reflective silicon rich layer serving as stop layer during the thinning of the assembled block copolymer layer.

11. The method according to claim 1, wherein the assembly guide comprises a plurality of openings forming guiding patterns distributed between the first and second areas of the substrate.

12. The method according to claim 11, wherein the guiding patterns have a height comprised between 5 nm and 1000 nm.

13. The method according to claim 11, wherein the surface of the guiding patterns has a particular affinity for one or more of the blocks of the block copolymer.

14. The method according to claim 11, wherein the bottom of the guiding patterns is neutral compared to the blocks of the block copolymer, and wherein the sides of the guiding patterns have a particular affinity for one or more of the blocks of the block copolymer.

15. The method according to claim 11, wherein the surface of the guiding patterns is neutral compared to the blocks of the block copolymer.

16. The method according to claim 13, wherein the particular affinity of the assembly guide for one or more blocks of the block copolymer is obtained by grafting of one or more homopolymers.

17. The method according to claim 14, wherein the neutralisation of the assembly guide is obtained by grafting of a random copolymer.

\* \* \* \* \*